United States Patent
Venugopal

(10) Patent No.: US 7,365,569 B1
(45) Date of Patent: Apr. 29, 2008

(54) HIGH-SPEED LEVEL SHIFTER

(75) Inventor: Rajesh Venugopal, Nashua, NH (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/408,687

(22) Filed: Apr. 20, 2006

Related U.S. Application Data

(60) Provisional application No. 60/685,228, filed on May 26, 2005.

(51) Int. Cl.
*H03K 19/0175* (2006.01)

(52) U.S. Cl. .............................. 326/81; 326/68; 326/80

(58) Field of Classification Search .................. 326/68, 326/80–81; 327/333
See application file for complete search history.

(56) References Cited

U.S. PATENT DOCUMENTS

| | | | |
|---|---|---|---|
| 5,650,971 | A | 7/1997 | Longway et al. |
| 6,028,448 | A | 2/2000 | Landry |
| 6,501,696 | B1 | 12/2002 | Mnich et al. |
| 6,707,741 | B1 | 3/2004 | Mnich et al. |
| 6,943,589 | B2 | 9/2005 | Dobberphul |
| 7,230,856 | B1 | 6/2007 | Venugopal et al. |
| 2006/0012415 | A1* | 1/2006 | Chen ........................... 327/333 |
| 2006/0071686 | A1* | 4/2006 | Chang ........................... 326/68 |

OTHER PUBLICATIONS

Cypress Semiconductor, Cypress Perform Preliminary, FullFlex(TM) Synchronous SDR Dual-Port SRAM, Revised Oct. 11, 2005, 49 pgs., Document # 38-06082 Re. *C. Cypress Semiconductor Corp., San Jose, CA.

Cypress Semiconductor Corporation, "FLEXx36.TM. 3.3V 32K/ 64K/128K/256K x36 Synchronous Dual-Port RAM", Data Sheet, 29 pages. Document #38-06070 Rev. *E, Revised Mar. 7, 2005. cited by other.

Cypress Semiconductor Corporation, "FLEXx36.TM, 3.3V 32K/ 64K/128K/256K x36 Synchronous Dual-Port RAM", Data Sheet, 31 pages. Document #38-06070 Rev. *G, Revised Aug. 15, 2005. cited by other.

* cited by examiner

*Primary Examiner*—Anh Q. Tran
(74) *Attorney, Agent, or Firm*—Blakely, Sokoloff, Taylor & Zafman LLP

(57) ABSTRACT

Embodiments of a high-speed level shifter are described. The level shifter may include a first transistor having a drain, a source, and a gate and a second transistor having a drain, a source, and a gate. The first and second transistors may be operable to receive a pair of differential signals. The level shifter may further include a third transistor having a drain, a source, and a gate, the drain of the third transistor directly coupled to the source of the first transistor, and the source of the third transistor directly coupled to the source of the second transistor. The gate of the third transistor is driven by a level-shifted version of an output voltage generated from the pair of differential signals.

20 Claims, 7 Drawing Sheets

| VHV | Current rise delay (ps) | Rise delay rev (ps) | Rise delay rev 2 (ps) | Current fall delay (ps) | Fall delayrev (ps) | Fall delayrev 1 (ps) | Current Skew 2 (ps) | Skew rev1 (ps) | Skewrev 2 (ps) |
|---|---|---|---|---|---|---|---|---|---|
| 2.5 | 229 | 207 | 172 | 121 | 127 | 104 | 108 | 80 | 68 |
| 3.3 | 226 | 207 | 158 | 154 | 163 | 109 | 72 | 44 | 49 |

FIG. 5

HIGH-SPEED LEVEL SHIFTER

REFERENCE TO RELATED APPLICATION

This application claims the benefit of U.S. Provisional Patent Application No. 60/685,228, filed on May 26, 2005.

TECHNICAL FIELD

The present invention relates generally to integrated circuits (ICs), and more particularly, to level shifters.

BACKGROUND

As integrated circuit (IC) process technology advances to higher densities, the feature size of a transistor is reduced enabling low-voltage high speed operation and high density layout. Another result of the reduced feature size is to also reduce the transistor's gate oxide voltage tolerance. Some conventional input/output (I/O) standards require an IC to interface with external voltages that are higher than the internal voltages used within the IC. Thus, it may be necessary to interface low-voltage transistors to high-voltage systems in some IC design. This is an important challenge in I/O design.

FIG. 1 shows a first conventional level shifter comprising a half latch made up of thick oxide transistors, which are transistors having relatively thick gate oxide. On the other hand, thin oxide transistors are transistors having relatively thin gate oxide. In general, thick oxide transistors are slower than thin oxide transistors. In general, the thickness of a gate of a transistor depends on the fabrication process, and hence, the defining dimensions for thick oxide transistors and thin oxide transistors also depend on the fabrication process. Thick oxide transistors are used in the conventional level shifter in FIG. 1, as thin oxide transistors may not tolerate high voltages across their gate to source terminals (Vgs) and across their gate to drain terminals (Vgd) due to higher electric fields across the oxide for the same Vgs or Vgd as compared to a thicker oxide. The electric field across the oxide is proportional to Vgs/tox, where tox is the thickness of the oxide, and when the electric field exceeds a critical value, the oxide breaks down and loses its insulating character. This makes thin oxide transistors more susceptible to breakdown at higher Vgs and Vgd voltages. Referring back to FIG. 1, the gates of transistors MN0 and MN1 are driven by low voltage differential input signals from the interior of the chip on which the level shifter is implemented. The low voltage differential input signals' maximum value is a level shifted high voltage value, VLV. The drains are connected via the p-type metal oxide semiconductor (PMOS) devices MP0 and MP1 to VLV.

The conventional level shifter 100 operates in the following manner. When input signal In is high, the gate of MP1 is pulled low and the output node 190 is pulled high to the value VHV. When Inb goes high and In goes low, MN1 pulls down the output node 190 and also turns on MP0, which in turn shuts off MP1. The speed of the level shifter 100 is limited by at least two factors. The first factor is the use of the slow thick oxide devices driven by low voltage signals, and the second factor is the contention between the N and P devices. MN1 and MN0 have to fight MP0 and MP1 during the falling and rising transitions of the output node 190. In the level shifter 100, the rise delay of the output is the critical path as it requires the discharge of the gate of MP1 and the charging of the output node 190.

A second conventional level shifter is shown in FIG. 2. The level shifter 200 is a modification of the level shifter 100 in FIG. 1, in which the contention between the pull-up PMOS and the pull-down n-type metal oxide semiconductor (NMOS) transistors is eliminated. The second conventional level shifter 200 comprises an inverter 11, a weak PMOS keeper transistor MP3, a PMOS transistor MP4, and a NMOS transistor MN2, all of which are thick oxide transistors.

Analyzing the rising transition of the output node 290, it is assumed that MN2 is turned on initially. When signal In rises, the signal In pulls down the gate of MP1, which in turn starts to charge up the output node 290. When the voltage at the output node 290 rises above the trip point of inverter I1, the output Y of inverter I1 goes low to turn off MN2 and to turn on MP4 and MP3. In a third step, this in turn turns off MP1, and the pull up of the output node 290 is completed by MP3. So, as long as the output node 290 voltage is above the trip point of the next stage when MP1 switches off, there is little or no penalty in the rise delay.

Analyzing the falling transition of the output node 290 when Inb goes high, MN1 in the level shifter 200 has to fight the weak keeper transistor MP3 instead of the strong pull-up transistor MP1, so the fall delay of the output node 290 may be improved by this change.

In a third conventional solution, a corresponding change may be made at node X of the level shifter 200 to improve the rising transition of the output node 290. However, there may be a penalty on doing so because there are two thick oxide NMOS transistors N10 and MN2 in the pull-down path of the gate of MP1.

BRIEF DESCRIPTION OF THE DRAWINGS

The present invention will be understood more fully from the detailed description that follows and from the accompanying drawings, which however, should not be taken to limit the appended claims to the specific embodiments shown, but are for explanation and understanding only.

FIG. 5 shows the speed improvement of one embodiment of a level shifter.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly couple and to indirectly couple through one or more intervening components.

In one embodiment, the level shifter may include a first transistor having a drain, a source, and a gate and a second transistor having a drain, a source, and a gate. The first and second transistors may be operable to receive a pair of differential signals, such as low voltage differential signals (LVDS). The level shifter may further include a third transistor having a drain, a source, and a gate, the drain of the third transistor directly coupled to the source of the first transistor, and the source of the third transistor directly coupled to the source of the second transistor. The gate of the third transistor is driven by a level-shifted version of an output voltage generated from the pair of differential signals.

Figure 3:
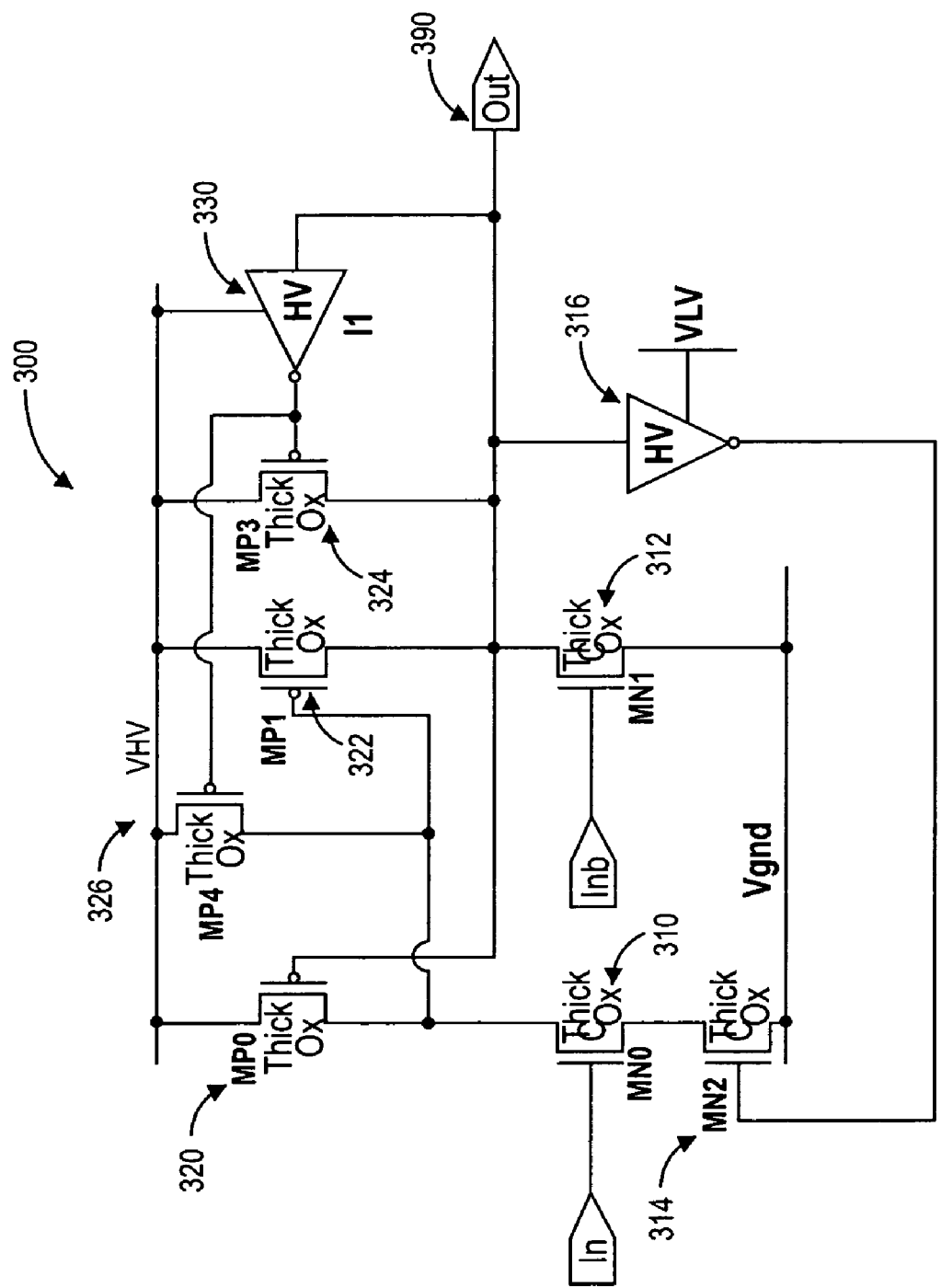
FIG. 3 shows one embodiment of a level shifter.

FIG. 3 shows one embodiment of a level shifter. The level shifter 300 includes a first and second pull-down transistors 310 and 312, a third transistor 314, a first inverter 316, a second inverter 330, four pull-up transistors 320, 322, 324, and 326, and an output node 390. The gates of the first and second pull-down transistors 310 and 312 receive a pair of input differential signals. The first inerter 316 is powered at VLV and the second inverter 330 is powered at VHV, where VHV is higher than VLV. In one embodiment, VLV is the maximum value the input differential signals. The source of the pull-up transistors 320, 322, 324, and 326 are coupled to the power supply VHV.

In one embodiment, the third transistor 314 is a thin oxide transistor while the remaining transistors in FIG. 3 are thick oxide transistors. In other words, the gate of the third transistor 314 is thinner than the gates of the remaining transistors. The thickness of the gates may depend on the semiconductor fabrication process used to manufacture the level shifter 300. For example, in one embodiment of a 65 nm process, the gate of a thin oxide transistor (e.g., the third transistor 314) may be within the range of about twelve to fifteen angstrom (Å) while the gate of a thick oxide transistor (e.g., transistors 310, 312, 320, 322, 324, and 326) may be about 50 Å. Note that in general, the thinner the gate of a transistor, the faster is signal transmission through the transistor. However, a transistor with thin gate oxide may be broken down at a lower gate voltage than a transistor with thick gate oxide.

Referring back to FIG. 3, the drain of the third transistor 314 is coupled to the source of the first pull-down transistor 310 while the source of the third transistor 314 is coupled to the source of the second pull-down transistor 312. The drain of the second pull-down transistor 312 is coupled to the output node 390. Furthermore, the drains of the pull-up transistors 322 and 324 and the inputs of the first and second inverters 316 and 330 are also coupled to the output node 390. The output of the first inverter 316 is coupled to the gate of the third transistor 314. The output of the second inverter 330 is coupled to the gate of the pull-up transistor 324 and the gate of the pull-up transistor 326. The drain of the pull-up transistor 326 is coupled to the drain of the first pull-down transistor 310 and the drain of the pull-up transistor 320. The gate of the pull-up transistor 320 is coupled to the output node 390.

In one embodiment, the level shifter 300 converts a pair of LVDS into a single output signal at the output node 390, which may have a voltage value higher than the pair of LVDS. As discussed above, the third transistor 314 is a thin oxide transistor. Thus, the third transistor 314 may not be driven by the high output voltage at the output node 390 directly to avoid breakdown. To protect the third transistor 314 from the high output voltage, the first inverter 316 is used. In one embodiment, the first inverter 316 is made up of thick oxide transistors and is powered by the lower supply voltage, VLV. The first inverter 316 may shift down the output voltage at the output node 390 to a voltage less than VLV. The third transistor 314 may be driven with this level-shifted version of the output voltage.

Figure 1:
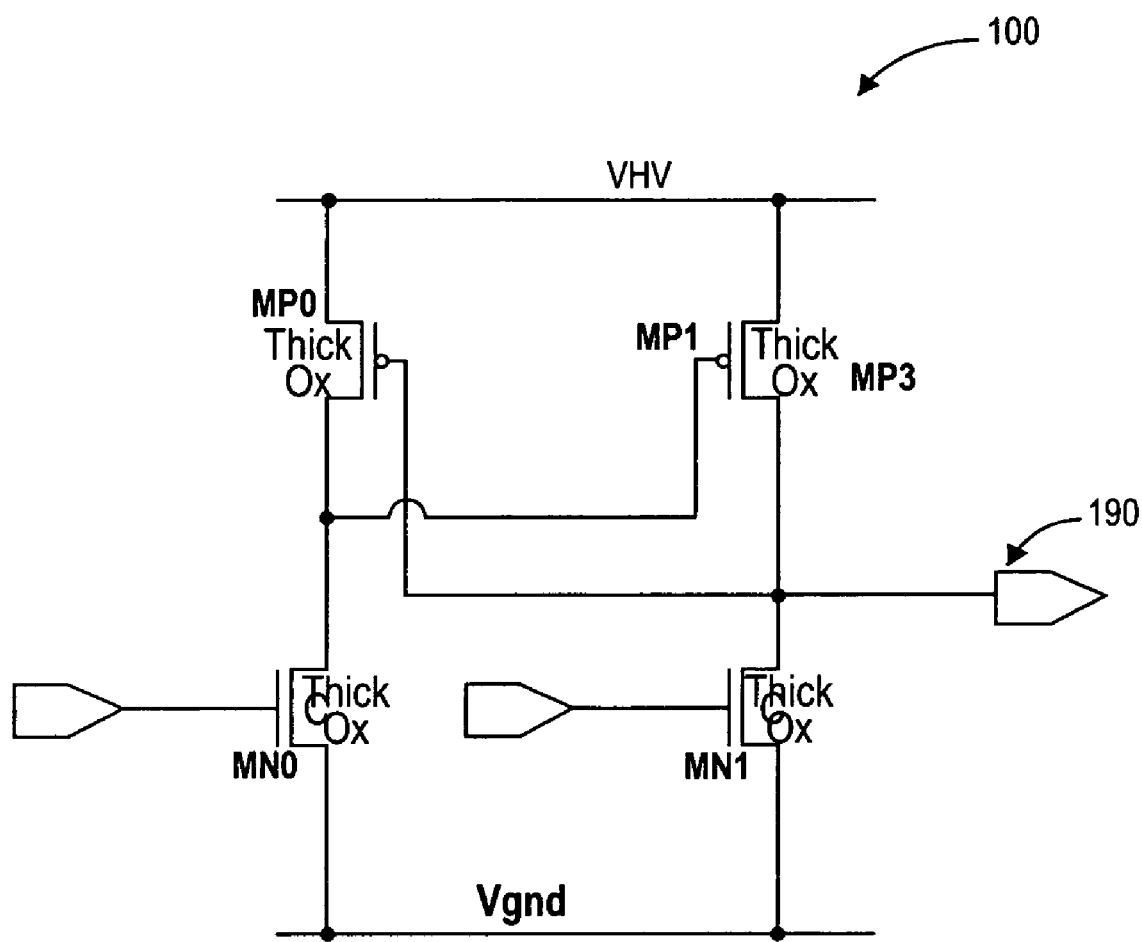
FIG. 1 shows a first conventional level shifter.
Figure 2:
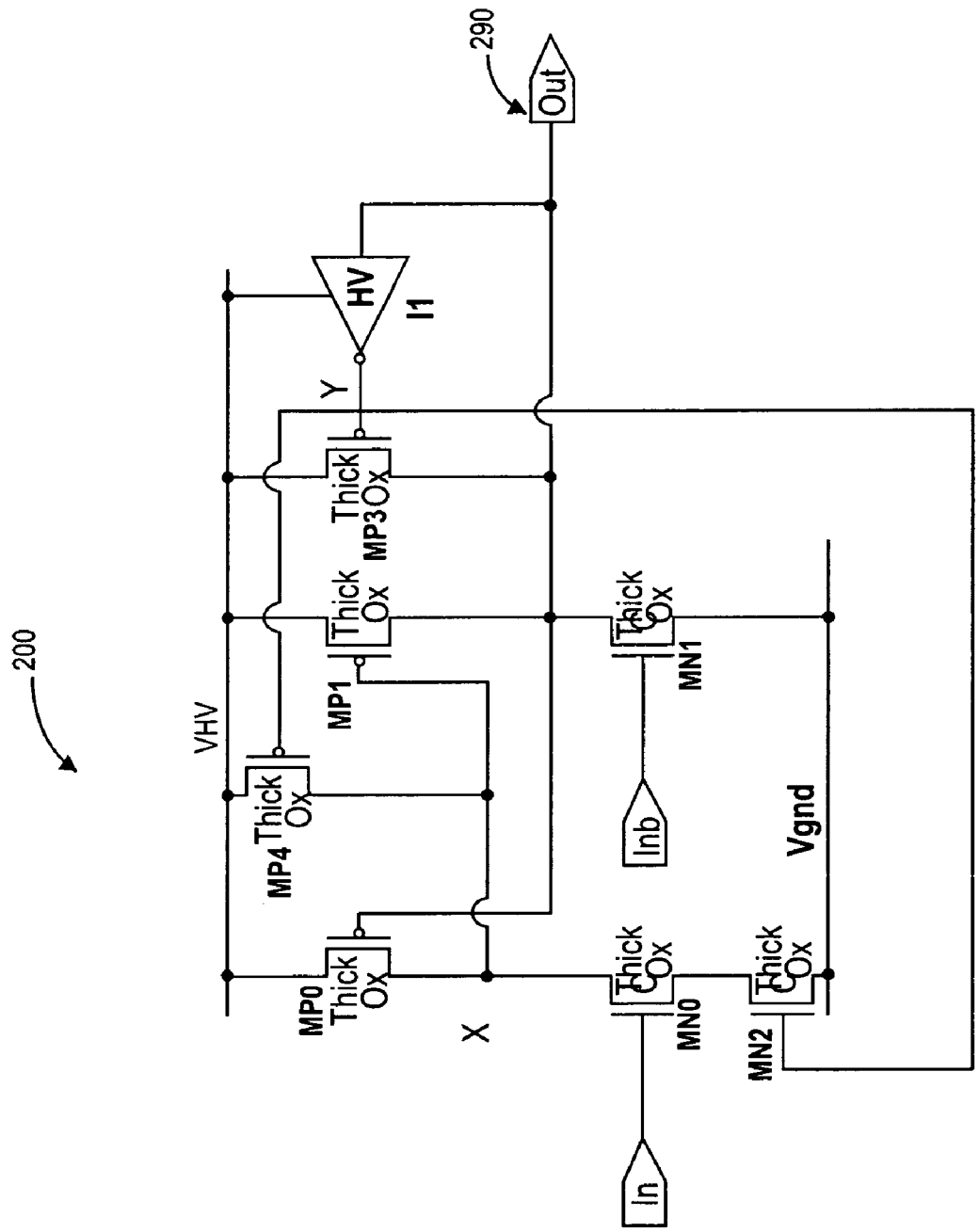
FIG. 2 shows a second conventional level shifter.

Note that instead of using the output of the first inverter 330 to turn off the third transistor 314 during the rising transition of the signal at the output node 390, the third transistor 314 is turned off by a level-shifted version of the output voltage at the output node 390. Since this turn off is in general not timing critical, so the third transistor 314 may be implemented by a thin oxide transistor. During the pull up of the output voltage at the output node 390, the resistance is that of the thick oxide transistor 310 and the thin oxide transistor 314, instead of the series combination of two thick oxide transistors as in the conventional level shifters shown in FIGS. 1 and 2. Thus, the pull up of the voltage at the output node 390 may be faster. The oxide of the third transistor 314 is protected as the voltage applied to the third transistor 314 may not exceed VLV-$V_{tn}$, where $V_{tn}$ is the threshold voltage of an n-type transistor in the first inverter 316.

In one embodiment, the improved level shifter 300 is made faster by introducing thin oxide transistors, such as the third transistor 314, as thin oxide transistors may have more than twice the current drive capability of thick oxide transistors for the same gate to source voltage. When using thin oxide transistors, the gate source voltage (Vgs) and gate drain voltage (Vgd) of the thin oxide transistors may not exceed a critical value to avoid a breakdown of the oxide.

Figure 4:
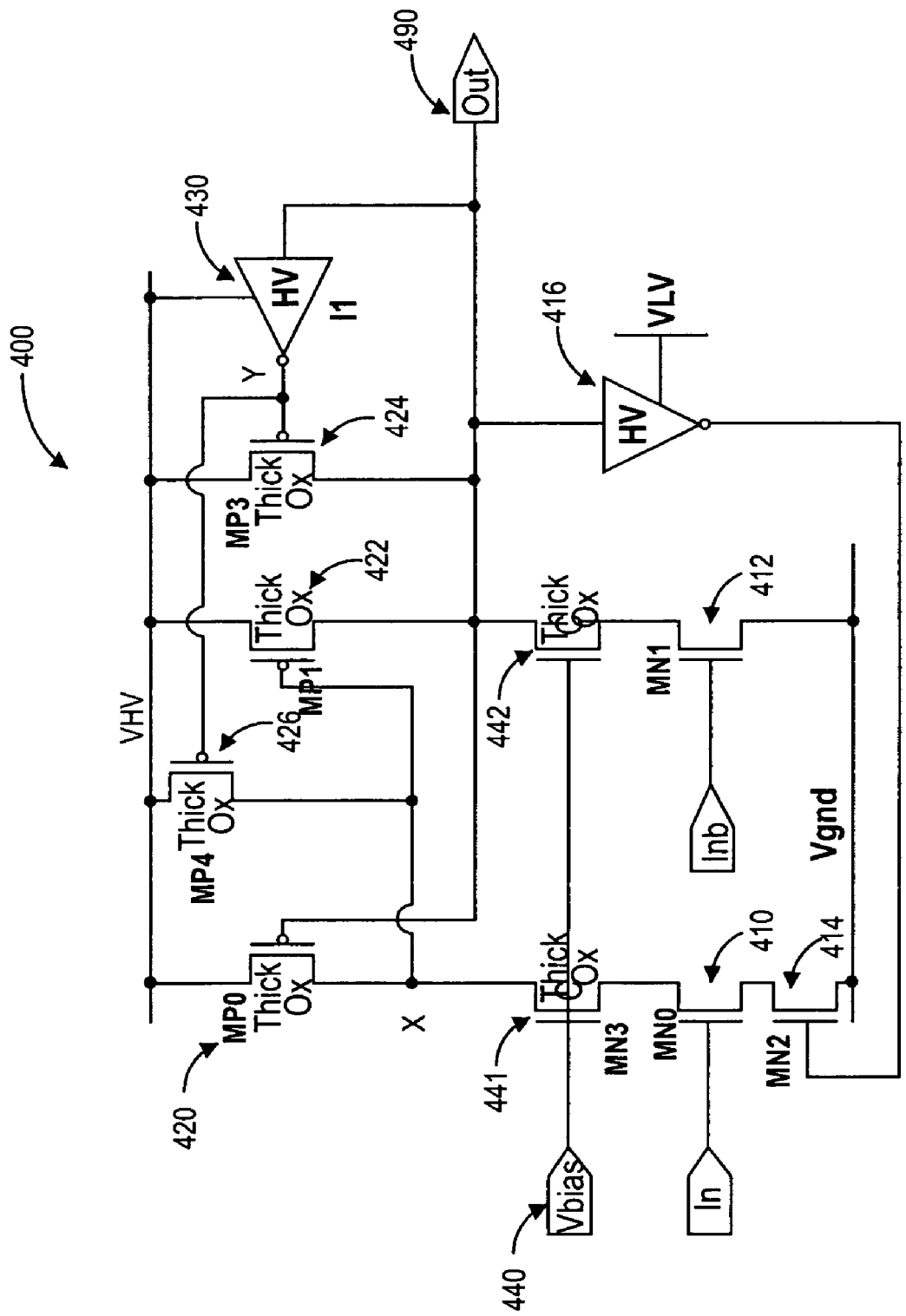
FIG. 4 shows an alternate embodiment of a level shifter.

FIG. 4 shows an alternate embodiment of a level shifter. The level shifter 400 includes a pair of pull-down transistors 410 and 412, a third transistor 414, a pair of bias transistors 441 and 442, a first inverter 416, a second inverter 430, and four pull-up transistors 420, 422, 424, and 426. The above components may be interconnected as described below.

In one embodiment, the source of the pull-down transistor 410 is coupled to the drain of the third transistor 414 and the source of the pull-down transistor 412 is coupled to the source of the third transistor 414, which is further coupled to ground. The drains of the pull-down transistors 410 and 412 are coupled to the sources of the bias transistors 441 and 442, respectively. The gates of the bias transistors 441 and 442 are driven by a static bias voltage 440. The drain of the bias transistor 441 is coupled to the drains of the pull-up transistors 420 and 426 and the gate of the pull-up transistor 422 at node X. The drain of the other bias transistor 442 is coupled to an output node 490 to provide the output voltage. Moreover, the gate of the pull-up transistor 420, the drains of the pull-up transistors 422 and 424, and the inputs of the first and second inverters 416 and 430 are also coupled to the output node 490. The source of the pull-up transistors 420, 422, 424, and 426 are coupled to the power supply VHV. The second inverter 430 is also powered by VHV. The first inverter 416 is powered by another supply voltage, VLV, which is lower than VHV.

Note that the transistors 410, 412, and 414 are thin oxide transistors, while the remaining transistors in FIG. 4 may be thick oxide transistors. Thin oxide transistors are generally faster than thick oxide transistors. However, as discussed earlier, thin oxide transistors are more susceptible to breakdown at high voltage than thick oxide transistors. Thus, the bias transistors 441 and 442 are added to shield the gates of the thin oxide transistors 410 and 412. The bias transistors 441 and 442 may be biased at a voltage substantially equal to VLV plus the threshold voltage (Vtn) of the bias transistors 441 and 442, respectively, which may be derived from a band gap circuit. In one embodiment that adopt the 3.3V I/O standard, the bias transistors 441 and 442 are implemented with thick oxide transistors in order to withstand higher voltages. Alternatively, for level shifters adopting a lower voltage I/O standard, such as the 2.5V I/O standard, the bias transistors 441 and 442 may be implemented with thin oxide transistors. Some of the speed improvements achieved are explained below.

In one embodiment, the pair of pull-down transistors 410 and 412 receive a pair of differential signals, such as LVDS, via the gates of the pull-down transistors 410 and 412. The level shifter 400 converts the pair of differential signals into a single output voltage at the output node 490. In one embodiment, the thin oxide transistors 410, 412, and 414 almost instantaneously discharge the sources of the bias transistors 441 and 442 to ground. The discharge of the gate of the pull-up transistor 422 or the discharge of the output voltage at the output node 490 may occur through the bias transistor 441, which may be a thick oxide transistor, biased a Vtn higher than what the gate voltage would have been in the conventional level shifters shown in FIGS. 1 and 2. Thus, a discharge path with a lower resistance is provided for the pull-up transistor 422 and the output node 490. In one embodiment, the bias transistors 441 and 442 are thin oxide transistors, and as a result, the resistance in the discharge path may be further reduced. Choosing the bias voltage (Vbias) to be substantially equal to VLV plus the Vtn of either one of the bias transistors 441 and 442 may protect the gates of the transistors 410 and 412.

The performance gain of one embodiment of the level shifter 400 is summarized in the table shown in FIG. 5. As shown in FIG. 5, there is about 16 to 25% speed improvement over some conventional level shifters for the same input and load capacitance.

Moreover, referring back to FIG. 4, it should be appreciated that nodes X and Y in the level shifter 400 are symmetric and replication of the circuitry on node Y may be done on node X to further speed up the level shifter 400.

Figure 6A:
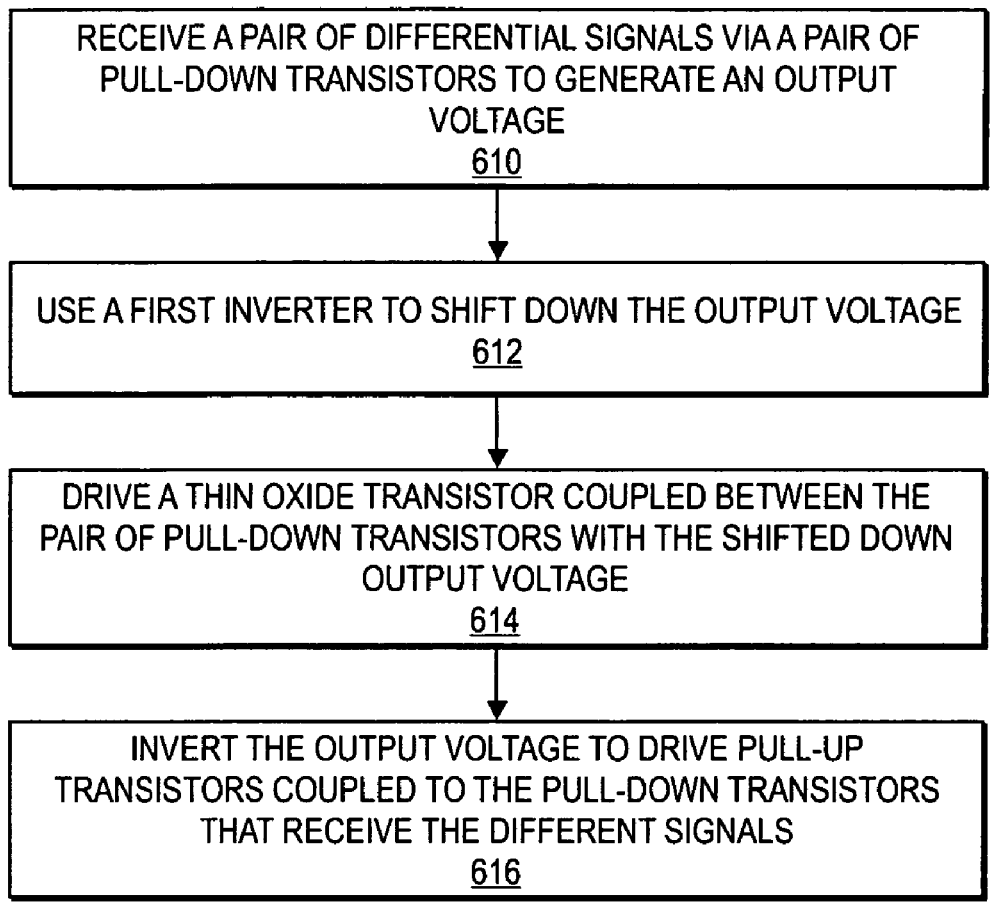
FIG. 6A shows one embodiment of a process to translate low voltage differential signals to a high voltage single-ended output.

FIG. 6A shows one embodiment of a process to translate differential signals to a high voltage single-ended output. The process is performed by processing logic that may comprise hardware (e.g., circuitry, dedicated logic, etc.), software (such as is run on a general-purpose computer system, a server, or a dedicated machine), or a combination of both.

In one embodiment, processing logic receives a pair of differential signals via a pair of pull-down transistors to generate an output voltage (processing block 610). Processing logic uses a first inverter to shift down the output voltage (processing block 612). Then processing logic drives a thin oxide transistor with the shifted down output voltage, the thin oxide transistor being coupled between the sources of the pull-down transistors (processing block 614). Processing logic further inverts the output voltage to drive a number of pull-up transistors coupled to the pair of pull-down transistors (processing block 616).

To further improve the speed of the process to translate differential signals to a high voltage single-ended output described above, the pair of pull-down transistors may be implemented with a pair of thin oxide transistors. However, since thin oxide transistors are more likely to break down at high voltage, protection of thin oxide transistors from the high voltage output is provided In one embodiment.

Figure 6B:
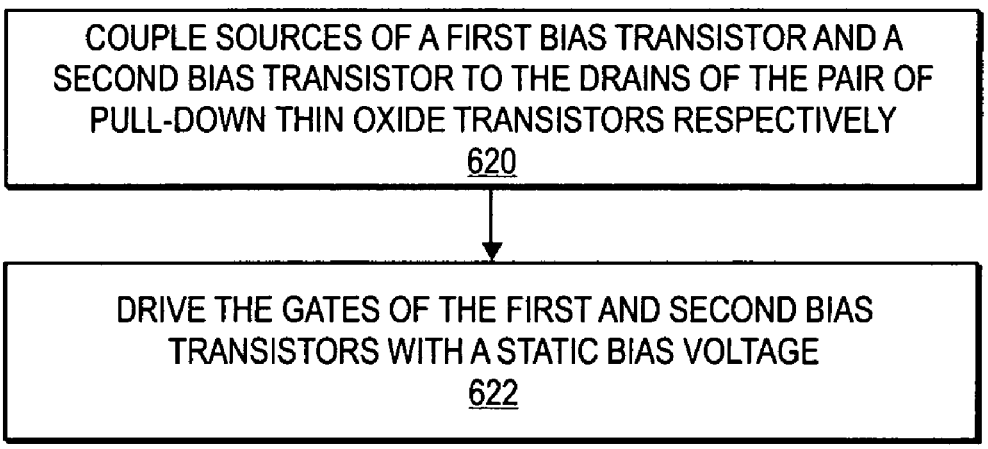
FIG. 6B shows one embodiment of a process to protect the pull-down transistors having thin gate oxide in a level shifter.

FIG. 6B shows one embodiment of a process to protect the pull-down thin oxide transistors in a level shifter. The process is performed by processing logic that may comprise hardware (e.g., circuitry, dedicated logic, etc.), software (such as is run on a general-purpose computer system, a server, or a dedicated machine), or a combination of both.

Processing logic couples the sources of a first bias transistor and a second bias transistor to the drains of the pair of pull-down thin oxide transistors respectively (processing block 620). In one embodiment, the first and second bias transistors are thick oxide transistors. Thus, the gates of the first and second bias transistors may be thicker than the gates of the pull-down transistors. Processing logic drives the gates of the first and second bias transistors with a static bias voltage (processing block 622). The high voltage output may be generated at the drain of the second bias transistor. By shielding the pull-down transistors from the high voltage output with the first and second bias transistors, the pull-down transistors are less likely to break down.

Figure 7:
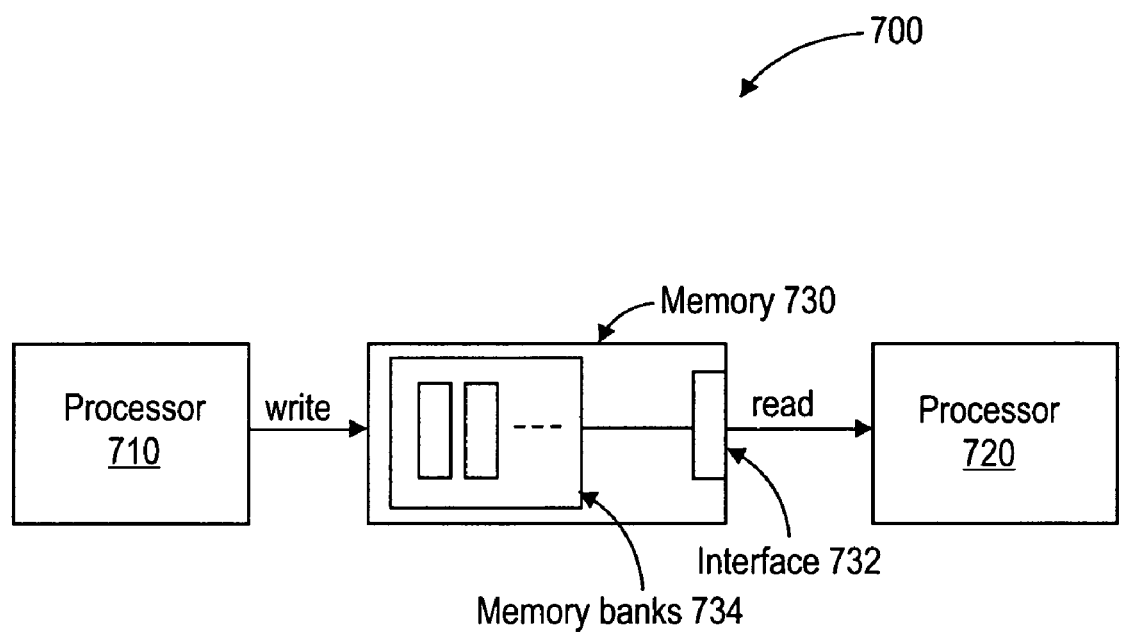
FIG. 7 shows an exemplary embodiment of a computing system usable with some embodiments of the level shifter.

FIG. 7 illustrates one embodiment of a computing system 700 usable with some embodiments of the level shifter described above. The computing system 700 includes two processors 710 and 720 and a memory 730. The memory 730 is coupled between the processors 710 and 720. Thus, the memory 730 may be referred to as a dual-port memory. In one embodiment, the memory 730 is synchronous memory. Alternatively, the memory 730 is asynchronous memory.

The memory 730 includes a number of memory banks 734 and an I/O interface 732. In one embodiment, the memory 730 allows processor 710 to write data into the memory 730 while the other processor 720 is reading data out of the memory 730. Data in the memory banks 734 may be output to the processor 720 via the I/O interface 732. In one embodiment, the I/O interface 732 includes a data output terminal and a level shifter. The level shifter is operable to convert a pair of differential signals from one of the memory banks 734 into a single signal to be output via the data output terminal. Details of some embodiments of the level shifter have been described above.

Note that any or all of the components of the computing system 700 and associated hardware may be used in various embodiments of the present invention. However, it can be appreciated that other configurations of the system 700 may include additional or fewer components than those illustrated in FIG. 7.

Furthermore, the system 700 described above is merely intended as an example to illustrate one application of the level shifter. It should be appreciated that the level shifter described above is applicable to other ICs and/or systems, such as those using differential data busses and pre-charge logic (e.g., single-port memory, content addressable memory, programmable logic device, etc.).

The foregoing discussion merely describes some exemplary embodiments of the present invention. One skilled in the art will readily recognize from such discussion, the accompanying drawings, and the claims that various modifications can be made without departing from the spirit and scope of the appended claims. The description is thus to be regarded as illustrative instead of limiting.

What is claimed is:

1. An apparatus comprising:
   a first transistor having a drain, a source, and a gate;
   a second transistor having a drain, a source, and a gate, the first and second transistors to receive a pair of differential signals;
   a third transistor having a drain, a source, and a gate, the drain of the third transistor directly coupled to the source of the first transistor, the source of the third transistor directly coupled to the source of the second transistor, wherein the gate of the third transistor is driven by a level-shifted version of an output voltage generated from the pair of differential signals;
a first inverter having an input and an output, the input coupled to the drain of the second transistor and the output coupled to the gate of the third transistor to shift down the output voltage to drive the third transistor;
a first bias transistor having a drain, a source, and a gate, the source of the first bias transistor coupled to the drain of the first transistor; and
a second bias transistor having a drain, a source, and a gate, the source of the second bias transistor coupled to the drain of the second transistor.

2. The apparatus of claim 1, wherein the gate of the first bias transistor is thicker than the gate of the first transistor and the gate of the second bias transistor is thicker than the gate of the second transistor.

3. The apparatus of claim 2, wherein the gate of the first bias transistor and the gate of the second bias transistor are coupled to a static bias voltage supply.

4. An apparatus comprising:
a first transistor having a drain, a source, and a gate;
a second transistor having a drain, a source, and a gate, the first and second transistors to receive a pair of differential signals;
a third transistor having a drain, a source, and a gate, the drain of the third transistor directly coupled to the source of the first transistor, the source of the third transistor directly coupled to the source of the second transistor, wherein the gate of the third transistor is driven by a level-shifted version of an output voltage generated from the pair of differential signals; and
a first inverter having an input and an output, the input coupled to the drain of the second transistor and the output coupled to the gate of the third transistor to shift down the output voltage to drive the third transistor, wherein the gate of the third transistor is thinner than the gate of the first transistor and the gate of the third transistor is thinner than the gate of the second transistor.

5. The apparatus of claim 4, further comprising:
a first pull-up transistor having a gate, a source, and a drain, the drain of the first pull-up transistor coupled to the drain of the first transistor and the gate of the first pull-up transistor coupled to the drain of the second transistor; and
a second pull-up transistor having a gate, a source, and a drain, the drain of the second pull-up transistor coupled to the drain of the second transistor and the gate of the second pull-up transistor coupled to the drain of the first transistor.

6. The apparatus of claim 5, further comprising:
a second inverter having an output and an input, the input of the second inverter coupled to the drain of the second transistor.

7. The apparatus of claim 6, further comprising:
a third pull-up transistor having a gate, a source, and a drain, the drain of the third pull-up transistor coupled to the drain of the second transistor and the gate of the third pull-up transistor coupled to the output of the second inverter; and
a fourth pull-up transistor having a gate, a source, and a drain, the drain of the fourth pull-up transistor coupled to the drain of the first transistor and the gate of the fourth pull-up transistor coupled to the output of the second inverter.

8. The apparatus of claim 6, wherein a first power supply to the first inverter is lower than a second power supply to the second inverter.

9. A memory comprising the apparatus of claim 1, wherein the memory further comprises:
a plurality of memory banks coupled to the first and second transistors; and
a first input/output (I/O) port comprising:
the first and second transistors, and
an output pad coupled to the drain of the second transistor.

10. The memory of claim 9, wherein the memory further comprises a second I/O port.

11. A system comprising the memory of claim 10, wherein the system further comprises:
a first processor coupled to the output pad of the first I/O port of the memory to receive data from the plurality of memory banks via the first I/O port; and
a second processor coupled to the plurality of memory banks via the second I/O port of the memory.

12. A method comprising:
receiving a pair of differential signals via a first and a second transistors to generate an output voltage;
shifting down the output voltage; and
driving a third transistor with the shifted output voltage, the third transistor having a drain, a source, and a gate, the drain of the third transistor directly coupled to a source of the first transistor, the source of the third transistor directly coupled to a source of the second transistor, wherein the gate of the third transistor is thicker than a gate of the first transistor and the gate of the third transistor is thicker than a gate of the second transistor.

13. The method of claim 12, further comprising:
coupling a first inverter between the gate of the third transistor and a drain of the second transistor to shift down the output voltage; and
driving a plurality of pull-up transistors coupled to the first and second transistors using a second inverter, wherein a first power supply to the first inverter is lower than a second power supply to the second inverter.

14. A method comprising:
receiving a pair of differential signals via a first and a second transistors to generate an output voltage;
shifting down the output voltage; and
driving a third transistor with the shifted output voltage, the third transistor having a drain, a source, and a gate, the drain of the third transistor directly coupled to a source of the first transistor, the source of the third transistor directly coupled to a source of the second transistor;
coupling a first bias transistor to the drain of the first transistor;
coupling a second bias transistor to the drain of the second transistor; and
driving the first and second bias transistors with a static bias voltage.

15. The method of claim 14, wherein a gate of the first bias transistor is thicker than a gate of the first transistor and a gate of the second bias transistor is thicker than a gate of the second transistor.

16. An apparatus, comprising:
means for receiving a pair of differential signals via a first and a second transistors to generate an output voltage;
means for shifting down the output voltage; and
means for driving a third transistor with the shifted output voltage, the third transistor having a drain, a source, and a gate, the drain of the third transistor directly coupled to a source of the first transistor, the source of the third transistor directly coupled to a source of the second transistor, wherein the gate of the third transistor is thicker than a gate of the first transistor and the gate of the third transistor is thicker than a gate of the second transistor.

17. The apparatus of claim 16, further comprising:
means for shielding the means for receiving the pair of differential signals from the output voltage.

18. A memory comprising the apparatus of claim 4, wherein the memory further comprises:
   a plurality of memory banks coupled to the first and second transistors; and
   a first input/output (I/O) port comprising:
      the first and second transistors, and
      an output pad coupled to the drain of the second transistor.

19. The memory of claim 18, wherein the memory further comprises a second I/O port.

20. A system comprising the memory of claim 19, wherein the system further comprises:
   a first processor coupled to the output pad of the first I/O port of the memory to receive data from the plurality of memory banks via the first I/O port; and
   a second processor coupled to the plurality of memory banks via the second I/O port of the memory.

* * * * *